US011456708B1

(12) United States Patent
Rattan (10) Patent No.: US 11,456,708 B1
(45) Date of Patent: Sep. 27, 2022

(54) REFERENCE GENERATION CIRCUIT FOR MAINTAINING TEMPERATURE-TRACKED LINEARITY IN AMPLIFIER WITH ADJUSTABLE HIGH-FREQUENCY GAIN

(71) Applicant: Kandou Labs SA, Lausanne (CH)

(72) Inventor: Suhas Rattan, London (GB)

(73) Assignee: KANDOU LABS SA, Lausanne (CH)

( * ) Notice: Subject to any disclaimer, the term of this patent is extended or adjusted under 35 U.S.C. 154(b) by 0 days.

(21) Appl. No.: 17/246,292

(22) Filed: Apr. 30, 2021

(51) Int. Cl.
| H03F 1/30 | (2006.01) |
| H03F 3/16 | (2006.01) |
| H03G 3/30 | (2006.01) |
| H03G 5/16 | (2006.01) |
| H03F 3/45 | (2006.01) |

(52) U.S. Cl.
CPC ............. *H03F 1/301* (2013.01); *H03F 3/16* (2013.01); *H03G 3/30* (2013.01); *H03G 5/165* (2013.01); *H03F 2200/447* (2013.01)

(58) Field of Classification Search
CPC ...... H03F 1/301; H03F 3/16; H03F 2200/447; H03G 3/30; H03G 5/165
USPC ......................................... 330/252–261, 283
See application file for complete search history.

(56) References Cited

U.S. PATENT DOCUMENTS

| 3,636,463 A | 1/1972 | Ongkiehong |
| 3,824,494 A | 7/1974 | Wilcox |
| 3,939,468 A | 2/1976 | Mastin |
| 4,276,543 A | 6/1981 | Miller et al. |
| 4,774,498 A | 9/1988 | Traa |
| 4,897,657 A | 1/1990 | Brubaker |
| 5,017,924 A | 5/1991 | Guiberteau et al. |

(Continued)

FOREIGN PATENT DOCUMENTS

| CN | 104242839 A | 12/2014 |
| EP | 0425064 A2 | 5/1991 |

(Continued)

OTHER PUBLICATIONS

Bae, Joonsung, et al., "Circuits and Systems for Wireless Body Area Network", Electromagnetics of Body-Area Networks: Antennas, Propagation, and RF Systems, First Edition, 2016, 375-403 (29 pages).

(Continued)

*Primary Examiner* — Hieu P Nguyen
(74) *Attorney, Agent, or Firm* — Invention Mine LLC (57) ABSTRACT

Equalizing an input signal according to a receiver equalizer peaking circuit having a capacitor FET (CFET) providing a capacitive value and a resistor FET (RFET) providing a resistive value, generating a capacitor control voltage at a gate of the CFET using a capacitor controller DAC based on a first reference voltage, and a RFET control voltage at a gate of the RFET using a resistor controller DAC based on a second reference voltage, generating the first reference voltage using a replica input FET, the first reference voltage varying according to a threshold voltage (Vt) of an input FET, providing the first reference voltage to the capacitor controller DAC, generating the second reference voltage using a replica RFET, the second reference voltage varying with respect to the first reference voltage and a Vt of the replica of the RFET, and providing the second reference voltage to the resistor controller DAC.

20 Claims, 4 Drawing Sheets

(56) References Cited

U.S. PATENT DOCUMENTS

| | | |
|---|---|---|
| 5,459,465 A | 10/1995 | Kagey |
| 5,510,736 A | 4/1996 | Van |
| 5,748,948 A | 5/1998 | Yu et al. |
| 5,777,568 A | 7/1998 | Inoue |
| 5,793,254 A | 8/1998 | OConnor |
| 5,945,935 A | 8/1999 | Kusumoto et al. |
| 6,094,075 A | 7/2000 | Garrett et al. |
| 6,226,330 B1 | 5/2001 | Mansur |
| 6,232,908 B1 | 5/2001 | Nakaigawa |
| 6,346,907 B1 | 2/2002 | Dacy et al. |
| 6,384,758 B1 | 5/2002 | Michalski et al. |
| 6,396,329 B1 | 5/2002 | Zerbe |
| 6,400,302 B1 | 6/2002 | Amazeen et al. |
| 6,462,584 B1 | 10/2002 | Proebsting |
| 6,546,063 B1 | 4/2003 | Lee et al. |
| 6,563,382 B1 | 5/2003 | Yang |
| 6,624,699 B2 | 9/2003 | Yin et al. |
| 6,839,587 B2 | 1/2005 | Yonce |
| 6,879,816 B2 | 4/2005 | Bult et al. |
| 6,888,483 B2 | 5/2005 | Mulder |
| 6,972,701 B2 | 12/2005 | Jansson |
| 7,075,996 B2 | 7/2006 | Simon et al. |
| 7,167,523 B2 | 1/2007 | Mansur |
| 7,188,199 B2 | 3/2007 | Leung et al. |
| 7,199,728 B2 | 4/2007 | Dally et al. |
| 7,269,212 B1 | 9/2007 | Chau et al. |
| 7,285,977 B2 | 10/2007 | Kim |
| 7,372,295 B1 | 5/2008 | Wei |
| 7,372,390 B2 | 5/2008 | Yamada |
| 7,397,302 B2 | 7/2008 | Bardsley et al. |
| 7,528,758 B2 | 5/2009 | Ishii |
| 7,560,957 B2 | 7/2009 | Chen et al. |
| 7,598,811 B2 * | 10/2009 | Cao .................. H03G 1/0088 330/254 |
| 7,635,990 B1 | 12/2009 | Ren et al. |
| 7,656,321 B2 | 2/2010 | Wang |
| 7,683,720 B1 | 3/2010 | Yehui et al. |
| 7,688,102 B2 | 3/2010 | Bae et al. |
| 7,688,887 B2 | 3/2010 | Gupta et al. |
| 7,697,915 B2 | 4/2010 | Behzad et al. |
| 7,804,361 B2 | 9/2010 | Lim et al. |
| 7,822,113 B2 | 10/2010 | Tonietto et al. |
| 7,957,472 B2 | 6/2011 | Wu et al. |
| 8,000,664 B2 | 8/2011 | Khorram |
| 8,030,999 B2 | 10/2011 | Chatterjee et al. |
| 8,106,806 B2 | 1/2012 | Toyomura et al. |
| 8,159,375 B2 | 4/2012 | Abbasfar |
| 8,159,376 B2 | 4/2012 | Abbasfar |
| 8,183,930 B2 | 5/2012 | Kawakami et al. |
| 8,537,886 B1 | 9/2013 | Shumarayev et al. |
| 8,547,272 B2 | 10/2013 | Nestler et al. |
| 8,581,824 B2 | 11/2013 | Baek et al. |
| 8,604,879 B2 | 12/2013 | Mourant et al. |
| 8,643,437 B2 | 2/2014 | Chiu et al. |
| 8,674,861 B2 | 3/2014 | Matsuno et al. |
| 8,687,968 B2 | 4/2014 | Nosaka et al. |
| 8,704,583 B2 | 4/2014 | Bulzacchelli et al. |
| 8,791,735 B1 | 7/2014 | Shibasaki |
| 8,841,936 B2 | 9/2014 | Nakamura |
| 8,860,590 B2 | 10/2014 | Yamagata et al. |
| 8,861,583 B2 | 10/2014 | Liu |
| 9,069,995 B1 | 6/2015 | Cronie |
| 9,106,462 B1 | 8/2015 | Aziz et al. |
| 9,106,465 B2 | 8/2015 | Walter |
| 9,148,087 B1 | 9/2015 | Tajalli |
| 9,178,503 B2 | 11/2015 | Hsieh |
| 9,281,785 B2 | 3/2016 | Sjöland |
| 9,281,974 B1 * | 3/2016 | Liu .................. H03F 3/45201 |
| 9,292,716 B2 | 3/2016 | Winoto et al. |
| 9,300,503 B1 | 3/2016 | Holden et al. |
| 9,705,708 B1 | 7/2017 | Jin et al. |
| 9,755,599 B2 | 9/2017 | Yuan et al. |
| 9,780,979 B2 * | 10/2017 | Sun .................. H04B 3/14 |
| 9,954,495 B1 * | 4/2018 | Chen .................. H03F 3/193 |
| 10,003,315 B2 | 6/2018 | Tajalli |
| 10,326,623 B1 | 6/2019 | Tajalli |
| 10,931,249 B2 | 2/2021 | Rattan et al. |
| 2001/0006538 A1 | 7/2001 | Simon et al. |
| 2002/0050861 A1 | 5/2002 | Nguyen et al. |
| 2002/0149508 A1 | 10/2002 | Hamashita |
| 2002/0158789 A1 | 10/2002 | Yoshioka et al. |
| 2002/0174373 A1 | 11/2002 | Chang |
| 2003/0016763 A1 | 1/2003 | Doi et al. |
| 2003/0085763 A1 | 5/2003 | Schrodinger et al. |
| 2003/0132791 A1 | 7/2003 | Hsieh |
| 2003/0160749 A1 | 8/2003 | Tsuchi |
| 2003/0174023 A1 | 9/2003 | Miyasita |
| 2003/0184459 A1 | 10/2003 | Engl |
| 2003/0218558 A1 | 11/2003 | Mulder |
| 2004/0027185 A1 | 2/2004 | Fiedler |
| 2004/0169529 A1 | 9/2004 | Afghani et al. |
| 2005/0008099 A1 | 1/2005 | Brown |
| 2005/0057379 A1 | 3/2005 | Jansson |
| 2005/0218980 A1 | 10/2005 | Kalb |
| 2005/0270098 A1 | 12/2005 | Zhang et al. |
| 2006/0036668 A1 | 2/2006 | Jaussi et al. |
| 2006/0097786 A1 | 5/2006 | Su et al. |
| 2006/0103463 A1 | 5/2006 | Lee et al. |
| 2006/0192598 A1 | 8/2006 | Baird et al. |
| 2006/0194598 A1 | 8/2006 | Kim et al. |
| 2007/0009018 A1 | 1/2007 | Wang |
| 2007/0097579 A1 | 5/2007 | Amamiya |
| 2007/0104299 A1 | 5/2007 | Cahn et al. |
| 2007/0159247 A1 | 7/2007 | Lee et al. |
| 2007/0176708 A1 | 8/2007 | Otsuka et al. |
| 2007/0182487 A1 | 8/2007 | Ozasa et al. |
| 2007/0188367 A1 | 8/2007 | Yamada |
| 2007/0201546 A1 | 8/2007 | Lee |
| 2007/0285156 A1 | 12/2007 | Roberts et al. |
| 2008/0001626 A1 | 1/2008 | Bae et al. |
| 2008/0107209 A1 | 5/2008 | Cheng et al. |
| 2008/0165841 A1 | 7/2008 | Wall et al. |
| 2008/0187037 A1 | 8/2008 | Bulzacchelli et al. |
| 2009/0090333 A1 | 4/2009 | Spadafora et al. |
| 2009/0115523 A1 | 5/2009 | Akizuki et al. |
| 2009/0146719 A1 | 6/2009 | Pernia et al. |
| 2009/0323864 A1 | 12/2009 | Tired |
| 2010/0148819 A1 | 6/2010 | Bae et al. |
| 2010/0156691 A1 | 6/2010 | Taft |
| 2010/0219781 A1 | 9/2010 | Kuwamura |
| 2010/0235673 A1 | 9/2010 | Abbasfar |
| 2010/0271107 A1 | 10/2010 | Tran et al. |
| 2011/0028089 A1 | 2/2011 | Komori |
| 2011/0032977 A1 | 2/2011 | Hsiao et al. |
| 2011/0051854 A1 | 3/2011 | Kizer et al. |
| 2011/0057727 A1 | 3/2011 | Cranford et al. |
| 2011/0096054 A1 | 4/2011 | Cho et al. |
| 2011/0103508 A1 | 5/2011 | Mu et al. |
| 2011/0133816 A1 | 6/2011 | Wu et al. |
| 2011/0156819 A1 | 6/2011 | Kim et al. |
| 2012/0025911 A1 | 2/2012 | Zhao et al. |
| 2012/0044021 A1 | 2/2012 | Yeh et al. |
| 2012/0133438 A1 | 5/2012 | Tsuchi et al. |
| 2012/0249217 A1 | 10/2012 | Fukuda et al. |
| 2013/0106513 A1 | 5/2013 | Cyrusian et al. |
| 2013/0114663 A1 | 5/2013 | Ding et al. |
| 2013/0147553 A1 | 6/2013 | Iwamoto |
| 2013/0195155 A1 | 8/2013 | Pan et al. |
| 2013/0215954 A1 | 8/2013 | Beukema et al. |
| 2013/0259113 A1 | 10/2013 | Kumar |
| 2013/0334985 A1 | 12/2013 | Kim et al. |
| 2014/0119479 A1 | 5/2014 | Tajalli |
| 2014/0176354 A1 | 6/2014 | Yang |
| 2014/0177696 A1 | 6/2014 | Hwang |
| 2014/0203794 A1 | 7/2014 | Pietri et al. |
| 2014/0266440 A1 | 9/2014 | Itagaki et al. |
| 2014/0312876 A1 | 10/2014 | Hanson et al. |
| 2015/0070201 A1 | 3/2015 | Dedic et al. |
| 2015/0146771 A1 | 5/2015 | Walter |
| 2015/0198647 A1 | 7/2015 | Atwood et al. |
| 2016/0013954 A1 | 1/2016 | Shokrollahi et al. |
| 2016/0087610 A1 | 3/2016 | Hata |
| 2016/0197747 A1 | 7/2016 | Ulrich et al. |
| 2017/0085239 A1 | 3/2017 | Yuan et al. |

(56) References Cited

U.S. PATENT DOCUMENTS

| | | | |
|---|---|---|---|
| 2017/0104458 A1 | 4/2017 | Cohen et al. |
| 2017/0214374 A1 | 7/2017 | Tajalli |
| 2017/0302237 A1 | 10/2017 | Akter et al. |
| 2017/0302267 A1 | 10/2017 | Luo |
| 2017/0309346 A1 | 10/2017 | Tajalli et al. |
| 2018/0076985 A1 | 3/2018 | Schell |
| 2019/0199557 A1 | 6/2019 | Taylor et al. |
| 2019/0221153 A1 | 7/2019 | Tsuchi et al. |
| 2019/0379340 A1 | 12/2019 | Rattan et al. |
| 2019/0379563 A1 | 12/2019 | Tajalli et al. |
| 2020/0321778 A1 | 10/2020 | Gharibdoust et al. |
| 2021/0248103 A1 | 8/2021 | Khashaba et al. |

FOREIGN PATENT DOCUMENTS

| | | |
|---|---|---|
| WO | 2018052657 A1 | 3/2018 |
| WO | 2019241081 A1 | 12/2019 |

OTHER PUBLICATIONS

Anadigm, "Using the Anadigm Multiplier CAM", Design Brief 208, www.anadigm.com, Copyright 2002,2002, (6 pages).

Dickson, Timothy, et al., "A 1.8 pJ/bit 16×16 GB/s Source-Sychronous Parallel Interface in 32 nm SOR CMOS with Receiver Redundancy for Link Recalibration", IEEE Journal of Solid-State Circuits, vol. 51, No. 8, Jul. 8, 2016, 1744-1755 (12 pages).

Kim, Kyu-Young, et al., "8 mW 1 65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Palmisano, G., et al., "A Replica Biasing for Constant-Gain CMOS Open-Loop Amplifiers", Circuits and Systems, IEEE International Symposium in Monterey, CA, May 31, 1998, 363-366 (4 pages).

Schneider, J., et al., "ELEC301 Project: Building an Analog Computer", http://www.clear.rice.edu/elec301/Projects99/anlgcomp/, Dec. 19, 1999, (9 pages).

Shekhar, S., et al., "Design Considerations for Low-Power Receiver Front-End in High-Speed Data Links", Proceedings of the IEEE 2013 Custom Integrated Circuits Conference, Sep. 22, 2013, 1-8 (8 pages).

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Tierney, J., "A Digital Frequency Synthesizer", Audio and Electroacoustics, IEEE Transactions, pp. 48-57, vol. 19, No. 1, Abstract, Mar. 1971, (1 page).

Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

* cited by examiner

REFERENCE GENERATION CIRCUIT FOR MAINTAINING TEMPERATURE-TRACKED LINEARITY IN AMPLIFIER WITH ADJUSTABLE HIGH-FREQUENCY GAIN

REFERENCES

The following prior applications are herein incorporated by reference in their entirety for all purposes:

U.S. application Ser. No. 16/378,461, filed Apr. 8, 2019, naming Suhas Rattan, entitled "Amplifier with Adjustable High-Frequency Gain Using Varactor Diodes", hereinafter referred to as [Rattan I].

BRIEF DESCRIPTION

Methods and systems are described for equalizing an input signal according to a receiver equalizer peaking circuit having a capacitor FET (CFET) providing a capacitive value and a resistor FET (RFET) providing a resistive value, generating a capacitor control voltage at a gate of the CFET using a capacitor controller DAC based on a first reference voltage, and a RFET control voltage at a gate of the RFET using a resistor controller DAC based on a second reference voltage, generating the first reference voltage using a replica input FET, the first reference voltage varying according to a threshold voltage (Vt) of an input FET, providing the first reference voltage to the capacitor controller DAC to maintain temperature-tracked DAC linearity, generating the second reference voltage using a replica RFET, the second reference voltage varying with respect to (i) the first reference voltage and (ii) a Vt of the replica of the RFET, and providing the second reference voltage to the resistor controller DAC to maintain the temperature-tracked DAC linearity.

Furthermore, a controller circuit providing bias to an amplifier circuit incorporating configurable frequency compensation is described, as well as a reference generation circuit providing reference voltages to the controller circuit, the combination being suitable for use as a continuous-time linear equalizer (CTLE) for communications receiver input signals. Elements of the design minimize behavioral variation over process, voltage, and temperature variation, while facilitating compact circuit layout with the configurable elements closely integrated with the analog devices they control.

DETAILED DESCRIPTION

Continuous-time Linear Equalization (CTLE) circuits are well known in the art. One common design is based on a conventional differential amplifier circuit utilizing a matched transistor pair having individual source loads but common drain connections to a fixed current sink. Splitting the current sink into two, one for each transistor drain, allows the drains to be cross-coupled with a frequency-dependent impedance such as a parallel RC network, modifying the essentially flat gain-vs-frequency characteristic of the basic differential amplifier into one having distinctly different low- and high-frequency gains.

In communications system receivers, such a CTLE circuit is typically configured to provide increased high-frequency gain to equalize or compensate for the inevitable high frequency loss of most communications media. In some embodiments, careful configuration of amplitude and equalization functions is performed to facilitate accurate signal detection and/or clock recovery by subsequent circuits. In some embodiments, a CTLE circuit in which both the gain characteristics and the frequency break points of such frequency-dependent compensation may be adjusted or configured.

Such CTLE circuits are intended for use in an integrated circuit environment processing extremely high frequency signals with minimal power consumption. The available power rails Vdd and Vss may typically provide one volt or less of operating voltage, thus microampere current flows imply path impedances of many thousands to millions of ohms. As resistances of these magnitudes may occupy substantial surface area in some integrated circuit processes, active circuit elements such as field effect transistors (FETs) may be preferable to passive element embodiments. Thus, as representative examples, the CTLE circuit of FIG. 1 as described by [Rattan I] incorporates MOS transistor 131 in which the channel resistance is used primarily as a source degeneration resistor, or resistor FET (RFET). Similarly, capacitive elements 133 and 134 are so-called varactor devices, although such elements are now typically implemented using the voltage-dependent gate-to-channel capacitance of a MOS transistor acting as a source degeneration capacitor (or capacitor FET, CFET) as an alternative to the historically original PN junction. Adjustment of gate voltage permits the effective channel resistance of such an RFET or body capacitance of such a CFET to be modified, facilitating control of the circuit's frequency response characteristics.

Figure 1:
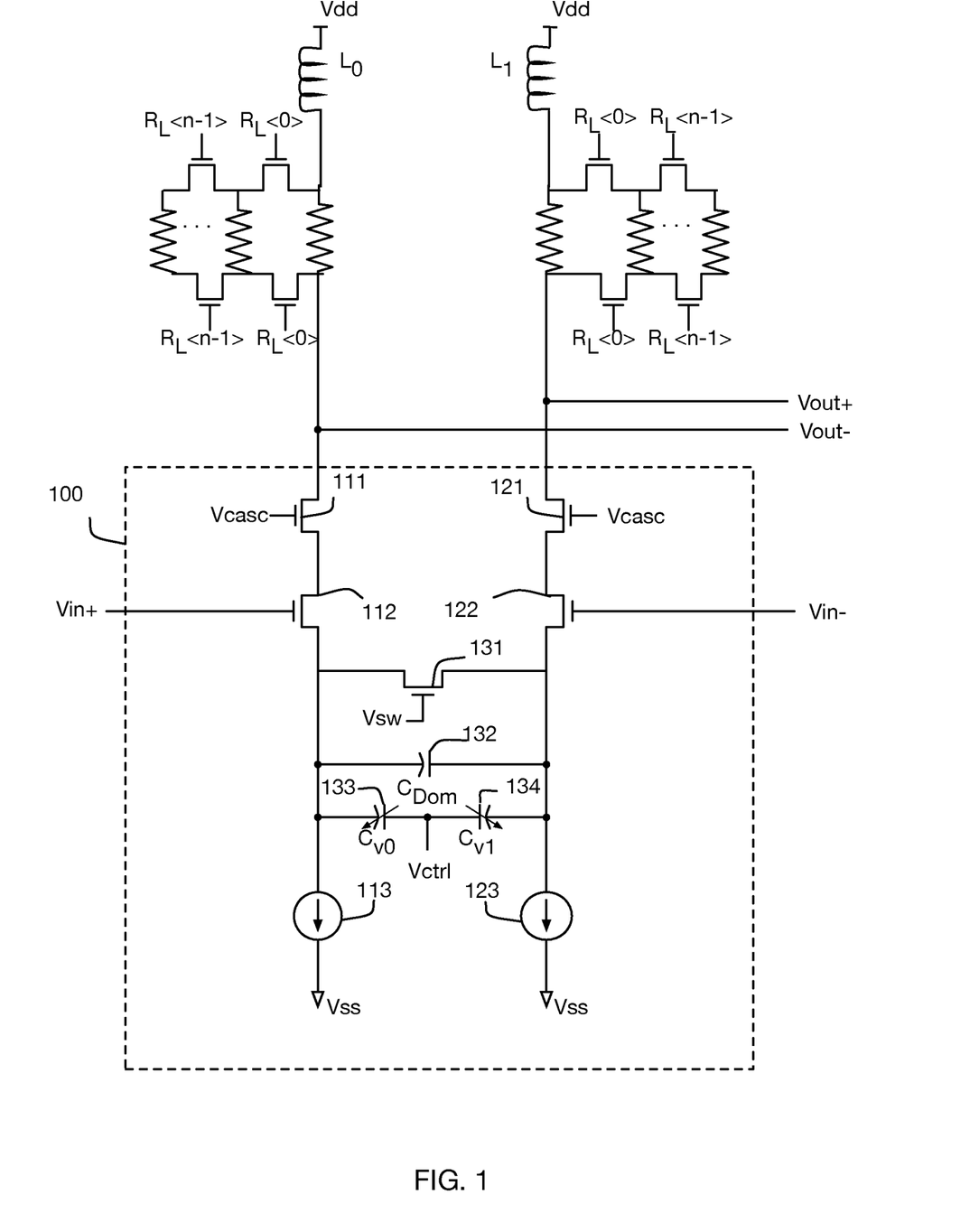
FIG. 1 is a circuit diagram of a CTLE amplifier.

The configurable CTLE circuit of FIG. 1 incorporates three degrees of adjustment capability, as overall gain may be adjusted by configuring the effective value of load resistance RL, the amount of high-frequency peaking may be adjusted by configuring the resistance of RFET 131, and the transition frequency at which high-frequency peaking begins may be adjusted by configuring the capacitance of CFETs 133 and 134. FIG. 1 shows that RL may be adjusted in discrete steps based on the number of parallel resistor elements enabled in the circuit, with the relative change occurring in each such adjustment step being primarily defined by circuit design, being only incidentally impacted by the effects of circuit voltage, temperature, and/or integrated circuit process variation.

In contrast, configuration of peaking amplitude and peaking transition frequency are implemented using inherently non-linear elements, gate voltage controlling MOS transistor channel resistance in the first case, and gate voltage controlling MOS transistor base-to-channel capacitance in the second case. It is well understood that the voltage-dependent body capacitance of MOS transistor devices is both non-linear and can be a function of time and general system characteristics, depending on the manufacturing process used and variations in operating temperatures. For example, charge density in active devices changes over time, with this effect being much more noticeable in small channel length devices. Similarly, the channel resistance of a MOS device also varies with not only gate voltage, but also temperature and process variations that modify the threshold voltage and other characteristics. Such operational or parametric variation with changes to supply voltage, operating temperature, and/or across device instances presenting variations in the integrated circuit process are herein collectively described as PVT (e.g. Process, Voltage, and Temperature) variation.

One may observe that even though the control voltages used to configure peaking amplitude and frequency are provided by, as one example, digital-to-analog converters delivering equal-sized voltage steps, the actual parametric change obtained by each such step will in practice be both non-linear and PVT dependent. Embodiments herein describe methods and systems for generating a first reference voltage vreg_cdeg that maintains temperature-tracked DAC linearity such that any capacitor controller digital-to-analog-converter (DAC) code provides a CFET control voltage that varies responsive to PVT yet maintains a desired capacitive value. Similarly, the methods and systems generate a second reference voltage vreg_rdeg that maintains temperature-tracked DAC linearity such that any resistor controller DAC code provides a RFET control voltage that varies responsive to PVT yet maintains a desired resistive value.

Compensation for PVT variations generally eschews absolute settings (e.g. a fixed bias to set the transistor operating point) for ratiometric ones that take advantage of the close matching of identical transistors with each other on the same integrated circuit die, even though their absolute functional parameters may vary widely over voltage, temperature, and process variations. Thus the basic amplification characteristics of the CTLE circuit of FIG. 1 are consistent and stable, due to the close matching of elements 111, 112, 113, to 121, 122, 123, even if, as one example, the exact current through 113/123 is not known. As shown herein, such ratiometric insensitivity to PVT may be incorporated into the other parametric controls of a CTLE.

Figure 4:
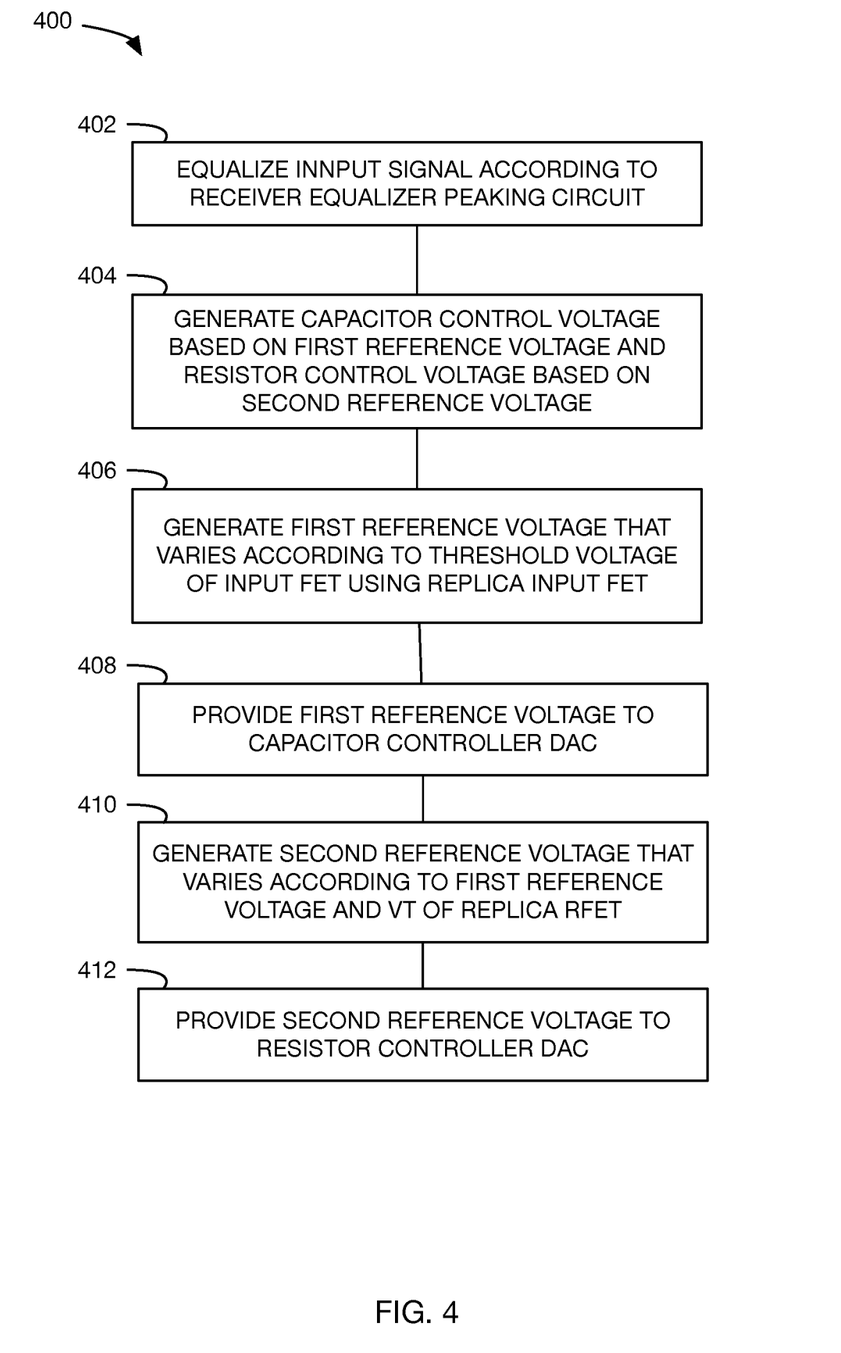
FIG. 4 is a flowchart of a method 400, in accordance with some embodiments.

As shown in FIG. 4, a flowchart of a method 400 is described herein, which may include equalizing 402 an input signal according to a receiver equalizer peaking circuit having a capacitor FET (CFET) providing a capacitive value and a resistor FET (RFET) providing a resistive value. A capacitor control voltage is generated 404 at a gate of the CFET 221/222 using a capacitor controller DAC 220 based on a first reference voltage vreg_cdeg, and a RFET control voltage at a gate of the RFET 231/232 using a resistor controller DAC 230 based on a second reference voltage vreg_rdeg. The first reference voltage is generated 406 using a replica input FET 311, where the first reference voltage varying according to a threshold voltage (Vt) of an input FET 241/242. The first reference voltage vreg_cdeg is provided 408 to the capacitor controller DAC 220 to maintain temperature-tracked DAC linearity such that a given capacitor controller DAC code provides a corresponding CFET control voltage that maintains a desired capacitive value of the CFET responsive to variations in e.g., temperature and/or common mode input. The second reference voltage vreg_rdeg is generated 410 using a replica RFET 351, the second reference voltage varying with respect to (i) the first reference voltage vreg_cdeg and (ii) variation in the threshold voltage Vt of the replica RFET 351. The second reference voltage is provided 412 to the resistor controller DAC 230 to maintain the temperature-tracked DAC linearity.

Figure 2:
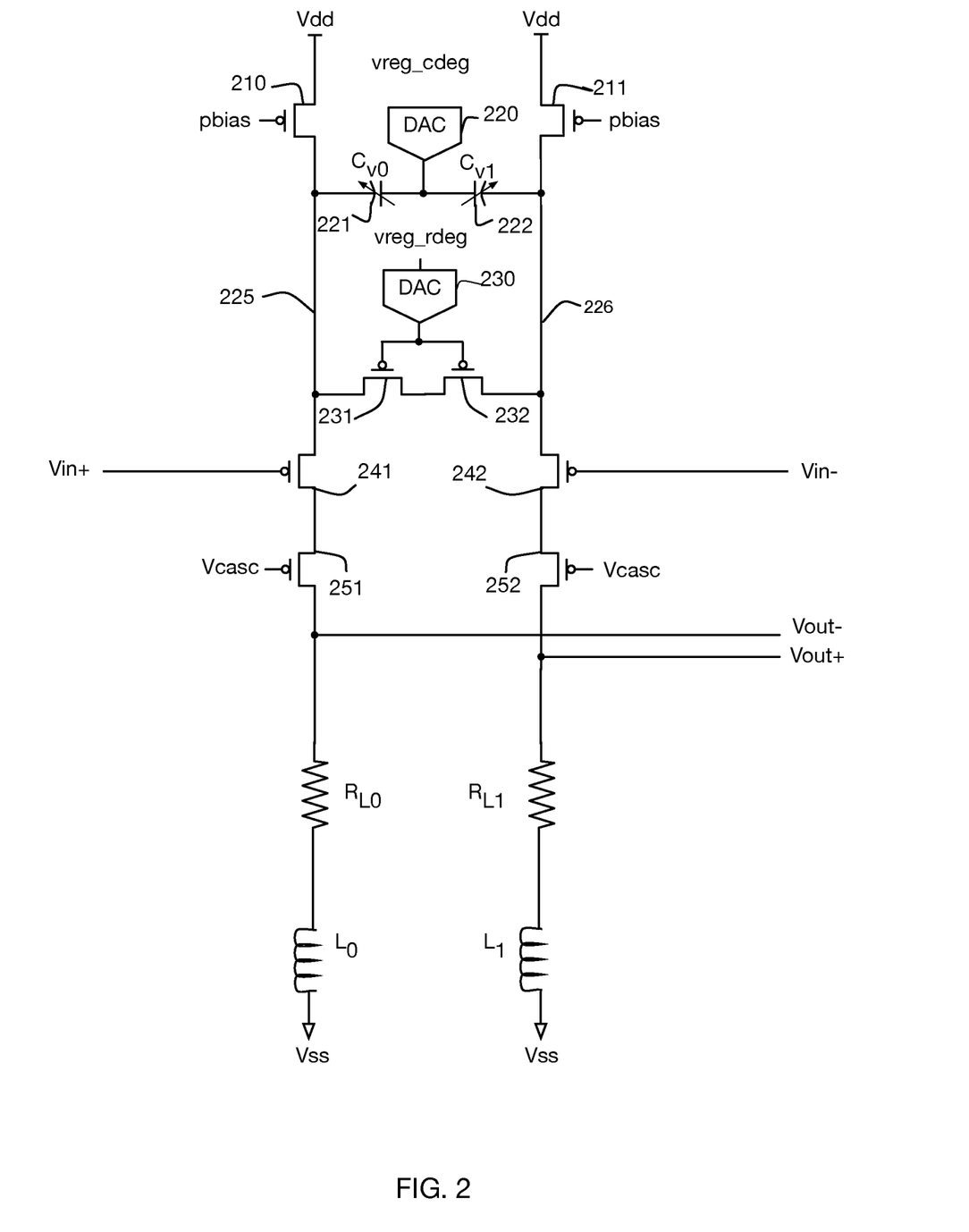
FIG. 2 is a simplified circuit diagram of a CTLE amplifier as in FIG. 2, showing two DAC adjustment controls.

The CTLE circuit of FIG. 2 explicitly shows adjustment of the RFET circuit composed of FETs 231/232 and CFET circuit composed of FETs 221/222 elements as being controlled by resistor controller and capacitor controller DACs 230 and 220 respectively. No limitation is implied, with subsequent references to control, compensation, or adjustment of elements of FIG. 2 being equally applicable to other CTLE circuits and/or controlling elements, in particular both the NMOS and PMOS designs of [Rattan I].

FIG. 2 is a schematic of a CTLE having a receiver equalizer peaking circuit that includes a CFET (shown as varactor connected diodes 221 and 222) providing a capacitive value and an RFET (shown as a source degeneration switch composed of active FETs 231 and 232) providing a resistive value. As shown, the capacitive and resistive values are cross-coupled between tail nodes 225 and 226 of a differential amplifier circuit and are adjustable to configure high-frequency peaking characteristics of the equalizer peaking circuit. Furthermore, FIG. 2 includes a controller circuit composed of a capacitor controller DAC 220 configured to provide a CFET control voltage to the DFET based on a first reference voltage vreg_cdeg and a resistor controller DAC 230 configured to provide an RFET control voltage to a gate of the RFET based on a second reference voltage vreg_rdeg. The first and second reference voltages may be generated using a reference generation circuit, described in further detail below with respect to FIG. 3. No limitation is implied, with subsequent references to control, compensation, or adjustment of elements of FIG. 2 being equally applicable to other CTLE circuits and/or controlling elements, in particular both the NMOS and PMOS designs of [Rattan I].

Figure 3:
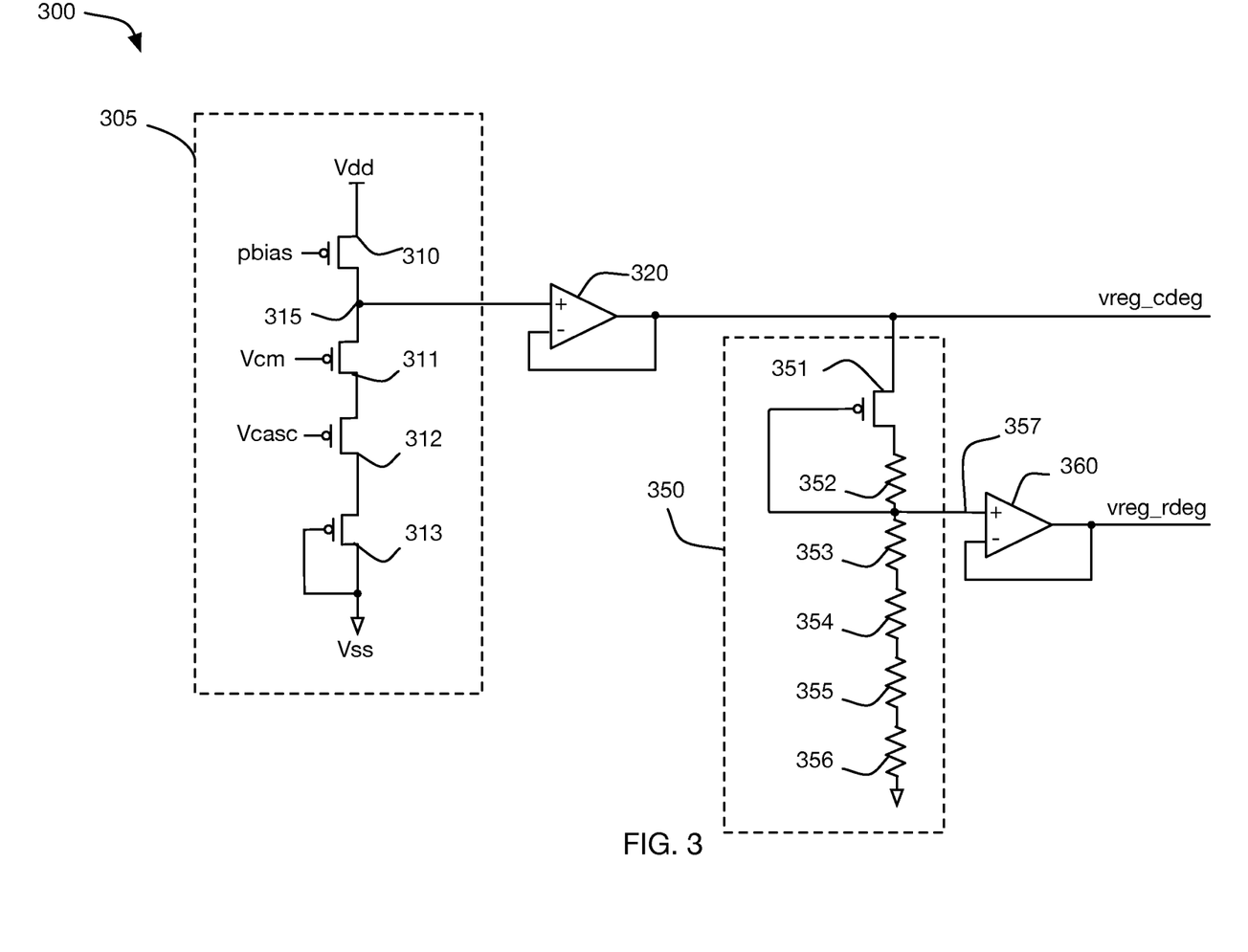
FIG. 3 is a circuit diagram providing pre-compensated bias voltages to a CTLE circuit.

As shown in FIG. 2, the gate-to-channel voltage that adjusts the effective body capacitance of varactors 221 and 222 is a function of the tail node voltage on tail nodes 225 and 226. As transistors used in varactor mode are generally kept in their channel-closed operating region, the turn-on threshold voltage Vt of transistors 221 and 222 is not relevant, thus the PVT compensation of the reference voltage provided to capacitor controller DAC 220 tracks tail node 225/226 voltage variations associated with variations in the Vt of input transistors 241 and 242. The reference generation circuit 300 of FIG. 3 is configured to generate the first reference voltage vreg_cdeg for the capacitor controller DAC 220 using replica input FET 311, where vreg_cdeg varies at least according to any variation in Vt of the input FETs 241/242. In some embodiments, vreg_cdeg may further vary according to variations in common mode input signal Vcm. As the reference voltage vreg_cdeg varies according to PVT, it follows that an output voltage of capacitor controller DAC 220 responsive to a corresponding capacitor controller DAC code will vary accordingly, the output voltage provided to the gates of the varactors 221 and 222 of the CFET to maintain temperature-tracked DAC linearity by keeping the CFET at a desired capacitive value despite e.g., temperature or common mode input variations.

Furthermore, the tail nodes 225/226 may be coupled together by configuring the RFET embodied by transistors 231 and 232. When configured by resistor controller DAC 230 to a low impedance, tail nodes 225 and 226 are forced to the same voltage which is essentially a function of voltage drop across current sources 210/211 and the voltage of 225 and 226 may vary with PVT according to e.g., temperature changes causing threshold voltage changes in the input FETs 241 and 242. Furthermore, when the RFET is configured by resistor controller DAC 230 to a higher impedance, the RFET embodied by FETs 231 and 232 have a gate-to-source voltage that is a function of both the DAC output voltage and the PVT-dependent tail node voltage. As shown in FIG. 3 the reference generation circuit generates a second reference voltage vreg_rdeg at the output of amplifier 360 that is provided to resistor controller DAC 230, where the second reference voltage vreg_rdeg varies with respect to (i) PVT variations in the input FETs 241/242 (as the voltage divider is operating according to the first reference voltage vreg_cdeg as a reference) and (ii) variations in threshold voltage of FETs 231 and 232 that compose the RFET. Thus, the second reference voltage vreg_rdeg similarly maintains temperature-tracked DAC linearity as any given DAC controller code provided to the resistor controller DAC will generate a corresponding RFET control voltage that varies accordingly to maintain a desired resistive value of the RFET across PVT.

The design of capacitor controller DAC 220 and resistor controller DAC 230 may follow conventional practices, with embodiments generally including a reference voltage source, a resistive ladder used to generate fractional parts or steps of said voltage, and selection of a particular step as the output value according to a corresponding DAC code. Multiple forms of resistive ladders are known in the art, including R-2R, binary weighted, linear chain, etc. Similarly, result selection may be controlled by binary, thermometer, or other control signal encoding, without limitation.

FIG. 3 is a schematic of one embodiment of a reference generation circuit 300 generating first and second reference voltages vreg_cdeg and vreg_rdeg, respectively, compensating for PVT. In some embodiments, the reference generation circuit 300 may include a scaled replica 305 of one leg of the actual CTLE circuit shown in FIG. 2 and may include current source 310 (which may correspond to a scaled replica of current sources 210/211 in FIG. 2), replica input FET 311 (which may correspond to a scaled replica of input FETs 241/242), and cascode transistor 312 (which may be a scaled replica of cascode transistors 251/252). The actual values of CTLE load resistor RLO and inductor LO do not significantly impact the tail node voltage, so in the replica circuit they may be replaced by the more compact load current sink 313, however no limitation is implied. The quiescent voltages of the actual differential circuit are the same on both legs, so only one half of the circuit may be duplicated in the reference generation circuit 300. The size and structural parameters of the replica current source, input, and cascode transistors may be identical to those of the actual CTLE instance of FIG. 2 and, as with the actual CTLE circuit, the replica current source may be biased by regulated voltage PBIAS, and the cascode transistor's gate biased by regulated voltage PCASC. Thus, node voltages within the reference generation circuit track those of the actual CTLE over variations in process, voltage, and temperature. In some lower-power embodiments, the elements of the replica circuit may be a scaled version of those in the CTLE circuit, in which a scaled current source may also be used to track the same voltage.

The CTLE circuit inputs include a differential signal superimposed on a DC bias voltage Vcm. In some embodiments the received input signals are AC coupled, and a local DC bias voltage Vcm is present at the CTLE inputs. The same local DC bias voltage, biases the replica input FET 311 of the reference generation circuit 300. In embodiments in which the received input signals are DC coupled and thus the CTLE inputs are biased by the actual input common-mode voltage, the input signals may be summed either passively with a resistor network or actively with a unity gain summing amplifier to provide Vcm to the reference generation circuit 300.

Node 315 of the reference generation circuit is equivalent to that of a tail circuit node 225/226 of the CTLE circuit of FIG. 2, thus the steady state voltage of node 315 tracks that of the tail circuit nodes 225/226 over PVT. Unity gain analog amplifier 320 buffers the voltage on node 315 to produce the first reference voltage vreg_cdeg, which provides the reference level for e.g., the resistive ladder of capacitor controller DAC 220 controlling the gates of varactors 221 and 222 of the CFET in the receiver equalizer peaking circuit. As the capacitance of varactors 221 and 222 are a function of their gate-to-channel voltage, (the channel voltage being in this example the tail circuit voltage of nodes 225 and 226), generating a reference voltage for capacitor controller DAC 220 that varies according to PVT will provide voltage outputs to the gate control of varactors 221 and 222 that track the tail circuit voltage, maintaining a near-constant voltage differential that minimizes capacitance variations for a given capacitor controller DAC code or adjustment value configuring capacitor controller DAC 220, regardless of variations of threshold voltage, supply voltage, or circuit operating temperature.

Reference voltage vreg_cdeg also powers the voltage divider 350 in the reference generation circuit 300 that tracks the variation in the threshold voltage of FETs 231/232 in the RFET and the thermal characteristics of resistor controller DAC 230's resistive ladder, represented in the reference generation circuit by replica RFET 351 and passive resistors 352, 353, 354, 355, 356. Specifically, replica RFET 351 (and additionally but not necessarily required, resistor 352) offset the voltage at node 357 from vreg_cdeg by an amount proportional at least to the threshold voltage Vt of the replica RFET 351. Similarly, for a given control code or adjustment value configuring resistor DAC 220, the resulting resistor control voltage so derived from reference voltage vreg_rdeg will track both (i) PVT variations of the voltages on tail nodes 225/226 (and therefore, variations in the threshold voltages Vt of input FETs 241 and 242) due to the voltage divider 350 operating according to vreg_cdeg, as well as (ii) threshold voltage Vt variations for the RFET transistors 231, 232 via replica RFET 351, i.e., the reference voltage vreg_rdeg for the source degeneration switch composed of RFET transistors 231 and 232 tracks the threshold voltage of the source degeneration switch itself.

As shown in FIG. 3, vreg_rdeg=vreg_cdeg−$V_{gs,351}$ (the threshold voltage of replica RFET 351). As e.g., temperature changes, the threshold voltage $V_{t,351}$ of replica RFET 351 changes, and thus the $V_{gs,351}$ also changes as $V_{gs,351}=V_{ds,351}+V_{t,351}$.

To minimize PVT variations, replica RFET 351 may be designed to be identical to FETs 231/232 of the RFET in the CTLE circuit of FIG. 2, and the resistive elements 352-356 may be matched to those used in resistor controller DAC 230.

One tap on the resistor ladder 350 of reference regeneration circuit 300 is buffered by unity gain analog amplifier 360 to produce reference voltage vreg_rdeg, which provides the reference level for resistor controller DAC 230 controlling the resistance of transistors 231 and 232. In some embodiments, resistor controller DAC 230 may include an equivalent structure as the resistor ladder 350 in the reference generation circuit. In one embodiment in accordance with FIGS. 2 and 3, resistor controller DAC 230 has an adjustment range between vreg_rdeg and Vss, essentially spanning the gate voltages in which the RFET 231/232 is in or near the active region, e.g. from cutoff to channel saturation. In some embodiments as shown in FIG. 3, the voltage divider circuit comprise at least one passive resistance element 352 between the output tap and the RFET 351, the passive resistive element 352 providing a voltage drop at least in part to increase a resolution of the resistor controller DAC. Utilizing resistor 352 in the reference generation circuit 300 to match the DAC output range to the useful control range for transistor resistance may minimize the number of useless (e.g. out of range) DAC settings, thus allowing use of a resistor controller DAC 230 having a higher resolution as the same number of codes may be available to resistor controller DAC 230, but with a lower total voltage range. Alternative embodiments may simply implement fewer adjustment steps in a more compact implementation than a conventional full-range DAC producing an output that is utilized over only part of its configurable range. In another embodiment, a different tap on the resistor ladder 350 of reference generation circuit 300 may be selected to obtain a different range, or to accommodate a different DAC topology.

In another embodiment, the fixed current passing through replica input FET 311 of the reference generation circuit is designed to be less than that of the actual CTLE circuit. In one particular embodiment, the proxy is operated at one fourth the differential circuit quiescent current, so as to reduce the overall standby current consumption of the system.

Just as [Rattan I] describes CTLE embodiments utilizing either PMOS or NMOS transistors, equivalent embodiments of the bias circuits described herein may be based on NMOS transistors rather than the PMOS transistors used in the present example, with the associated translation of supply voltages, reference voltages, and adjustment ranges understood to be associated with such modification. Similarly, no limitation to a single transistor type is implied, as further embodiments may incorporate mixed combinations of PMOS and NMOS devices.

I claim:

1. An apparatus comprising:
    a receiver equalizer peaking circuit having a capacitor Field Effect Transistor (CFET) providing a capacitive value and a resistor FET (RFET) providing a resistive value;
    a controller circuit comprising a capacitor controller digital-to-analog converter (DAC) configured to provide a CFET control voltage to the CFET based on a first reference voltage, and a resistor controller DAC configured to provide a RFET control voltage to a gate of the RFET based on a second reference voltage;
    a reference generation circuit configured to generate the first and second reference voltages, the reference generation circuit comprising:
        a replica input FET configured to generate the first reference voltage that varies at least according to a threshold voltage (Vt) of an input FET, the replica input FET configured to provide the first reference voltage to the capacitor controller DAC to maintain temperature-tracked DAC linearity;
        a replica RFET configured to generate the second reference voltage that varies with respect to (i) the first reference voltage and (ii) a Vt of the RFET, and to provide the second reference voltage to the resistor controller to maintain the temperature-tracked DAC linearity.

2. The apparatus of claim 1, wherein the first reference voltage further varies responsive to variations in a common mode voltage of an input signal received at the input FET.

3. The apparatus of claim 1, wherein the replica RFET is part of a voltage divider circuit, and wherein the second reference voltage is generated at an output tap of the voltage divider circuit.

4. The apparatus of claim 3, wherein the replica RFET has a gate input connected to the output tap of the voltage divider circuit.

5. The apparatus of claim 3, wherein the voltage divider circuit is a replica of a voltage divider in the resistor controller DAC.

6. The apparatus of claim 3, wherein the voltage divider circuit comprise at least one passive resistance element between the output tap and the RFET, the passive resistive element providing a voltage drop at least in part to increase a resolution of the resistor controller DAC.

7. The apparatus of claim 1, wherein the replica input FET is a scaled version of the input FET.

8. The apparatus of claim 1, wherein the CFET control voltage and the RFET control voltage are variable output voltages that vary according to variations in the first and second reference voltages, respectively.

9. The apparatus of claim 1, wherein the second reference voltage further tracks the Vt of the input FET.

10. The apparatus of claim 1, wherein the CFET is connected in a varactor diode configuration, and wherein the CFET control voltage is provided to a gate of the CFET.

11. A method comprising:
    equalizing an input signal according to a receiver equalizer peaking circuit having a capacitor FET (CFET) providing a capacitive value and a resistor FET (RFET) providing a resistive value;
    generating a capacitor control voltage at a gate of the CFET using a capacitor controller DAC based on a first reference voltage, and a RFET control voltage at a gate of the RFET using a resistor controller DAC based on a second reference voltage;
    generating the first reference voltage using a replica input FET, the first reference voltage varying according to a threshold voltage (Vt) of an input FET;
    providing the first reference voltage to the capacitor controller DAC to maintain temperature-tracked DAC linearity;
    generating the second reference voltage using a replica RFET, the second reference voltage varying with respect to (i) the first reference voltage and (ii) a Vt of the replica of the RFET; and
    providing the second reference voltage to the resistor controller DAC to maintain the temperature-tracked DAC linearity.

12. The method of claim 11, wherein the first reference voltage further varies responsive to variations in a common mode voltage of an input signal received at the input FET.

13. The method of claim 11, wherein generating the second reference voltage comprises generating a current through a voltage divider circuit containing the replica RFET, wherein the current varies responsive at least in part to variations in resistance of the replica RFET, and wherein the second reference voltage is generated at an output tap of the voltage divider circuit.

14. The method of claim 13, wherein the replica RFET has a gate input connected to the output tap of the voltage divider circuit.

15. The method of claim 13, wherein the voltage divider circuit is a replica of a voltage divider in the resistor controller DAC.

16. The method of claim 13, wherein the output tap of the voltage divider circuit is separated from the replica RFET by at least one passive resistance element, the passive resistance element generating a voltage drop at least in part for increasing a resolution of the resistor controller DAC.

17. The method of claim 11, wherein the replica input FET is a scaled version of the input FET.

18. The method of claim 11, wherein the first reference voltage is process-dependent with respect to the input FET.

19. The method of claim 11, wherein the second reference voltage is process-dependent with respect to the input FET and the RFET.

20. The method of claim 11, wherein the CFET comprises a varactor diode.

* * * * *